(12) United States Patent
Gazda

(10) Patent No.: US 7,842,880 B2
(45) Date of Patent: Nov. 30, 2010

(54) WEAVABLE FIBER PHOTOVOLTAIC COLLECTORS

(75) Inventor: Jerzy Gazda, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 239 days.

(21) Appl. No.: 11/947,424

(22) Filed: Nov. 29, 2007

(65) Prior Publication Data

US 2009/0139572 A1  Jun. 4, 2009

(51) Int. Cl.
*H02N 6/00*  (2006.01)
*H01L 31/042*  (2006.01)
*H01L 31/00*  (2006.01)

(52) U.S. Cl. .................. 136/250; 136/261

(58) Field of Classification Search ......... 136/261, 136/250
See application file for complete search history.

(56) References Cited

U.S. PATENT DOCUMENTS

| | | | | |
|---|---|---|---|---|
| 4,105,471 A | * | 8/1978 | Yerkes et al. ............... | 136/256 |
| 4,278,704 A | * | 7/1981 | Williams .................... | 438/98 |
| 5,269,852 A | * | 12/1993 | Nishida ...................... | 136/258 |
| 5,466,301 A | * | 11/1995 | Hammerbacher et al. ... | 136/246 |
| 5,738,731 A | * | 4/1998 | Shindo et al. ............... | 136/249 |
| 6,211,454 B1 | * | 4/2001 | Sano .......................... | 136/258 |
| 2005/0040374 A1 | * | 2/2005 | Chittibabu et al. ....... | 252/501.1 |

* cited by examiner

Primary Examiner—Jeffrey T Barton
Assistant Examiner—Allison Bourke
(74) Attorney, Agent, or Firm—Turocy & Watson, LLP

(57) ABSTRACT

Photovoltaic fibers and methods of making photovoltaic fibers are provided. The photovoltaic fiber contains a core, bottom metal-semiconductor compounds over the core, a semiconductor layer comprising semiconductor elements and insulating materials over the bottom metal-semiconductor compounds, and upper metal-semiconductor compounds over the semiconductor layer. The photovoltaic fiber can be weavable. Fabrics including the photovoltaic fibers can be utilized in any suitable application or photovoltaic collector.

20 Claims, 7 Drawing Sheets

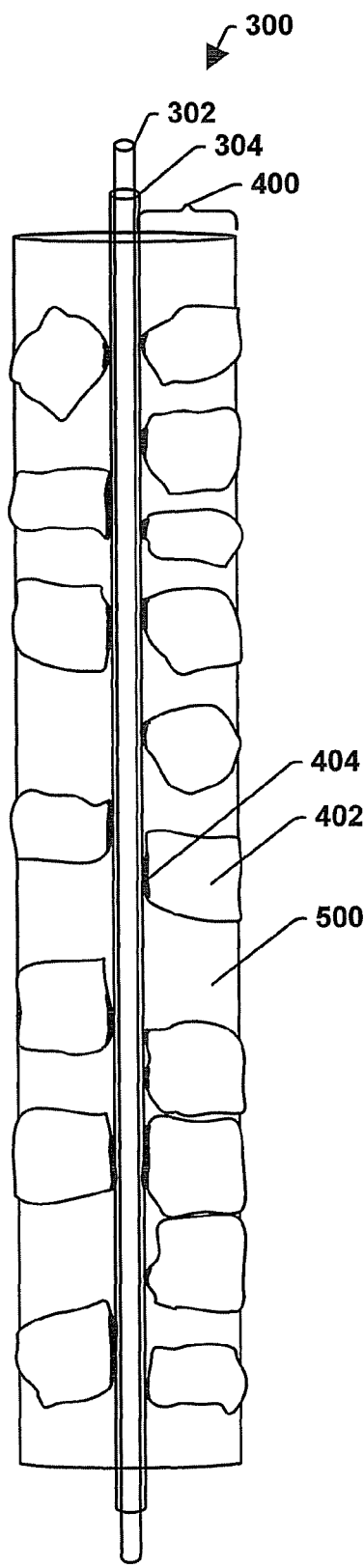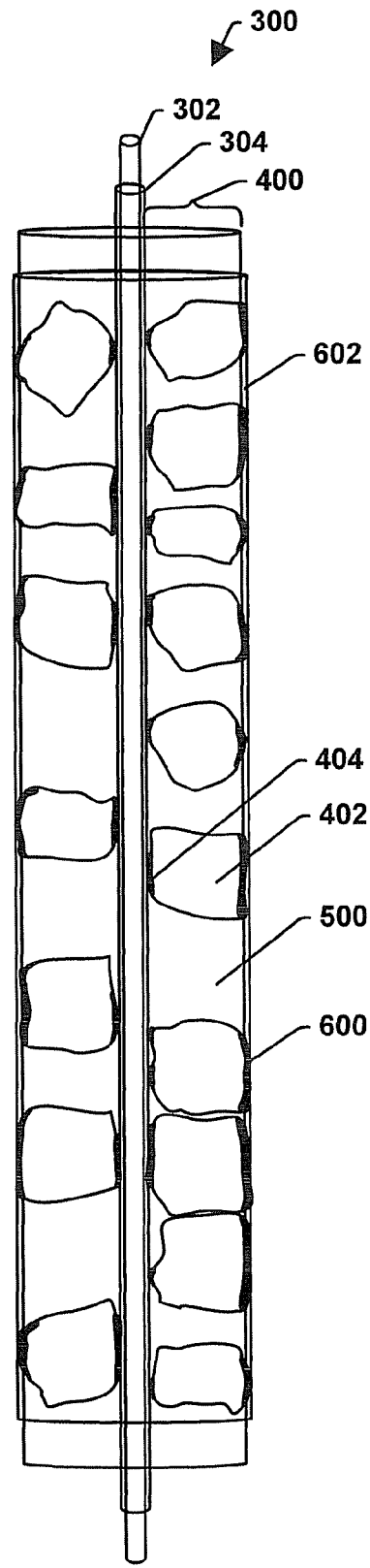
Figure 5
Figure 6

WEAVABLE FIBER PHOTOVOLTAIC COLLECTORS

TECHNICAL FIELD

Described are photovoltaic fibers and methods of making photovoltaic fibers.

BACKGROUND

The most readily available source of renewable energy is the sun. Solar energy can be harnessed and converted directly into electrical energy by the use of photovoltaic collectors or solar cells. Photovoltaic collectors or solar cells can be semiconductor devices which convert sunlight into electricity. At the heart of such devices is a semiconductor p-n junction which forms a photo diode. When the p-n junction is illuminated with light of an appropriate wavelength, an electron-hole pair is generated; the electron and the hole are pulled in opposite directions by the internal electric fields of the p-n junction. The resulting photo current can be used to drive an electrical appliance downstream such as a pocket calculator or a battery charger.

Conventional photovoltaic collector generators typically employ the use of high purity, single crystal silicon (e.g., crystal ingot) which is doped to produce either a p-type or n-type material. The doped crystal is sliced into discs or wafers and, depending upon the doping, either an electron donor or an electron acceptor is diffused into selected regions to form p-n junctions. Electrodes are then applied respectively to the diffused and no diffused regions.

In conventional photovoltaic collectors, the major cost factor is determined by the requirement of sawing silicon ingots into discs or wafers. Sawing is an expensive process, and results in the loss of approximately half the costly crystal ingot material as silicon dust. This technique, while resulting in the production of an acceptable photovoltaic device, is expensive and time-consuming, particularly in the cost of diamond sawing the silicon. Furthermore, the size of the photovoltaic collectors is limited by the size of the wafer which is, in turn, limited by the size of the single crystal ingot. While the size may be increased using cast silicon sheet, the costs are commensurately increased by the use of such techniques.

SUMMARY

The following presents a simplified summary of the innovation in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the subject innovation described herein provides photovoltaic fibers. The photovoltaic fiber contains a core, bottom metal-semiconductor compounds over the core, a semiconductor layer containing semiconductor elements and insulating materials over the bottom metal-semiconductor compounds, and upper metal-semiconductor compounds over the semiconductor elements. The photovoltaic fiber can be weavable. Fabrics including the photovoltaic fibers can be utilized in any suitable application or photovoltaic collector.

Another aspect of the subject innovation described herein provides methods of making a photovoltaic fiber. The method can involve forming a bottom conductive layer over a core, forming a semiconductor layer containing semiconductor elements, forming bottom metal-semiconductor compounds between the bottom conductive layer and the semiconductor elements, forming insulating materials in the semiconductor layer, and forming upper metal-semiconductor compounds at upper surfaces of the semiconductor elements.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

BRIEF DESCRIPTION OF THE DRAWINGS

FIGS. 3-7 illustrate forming a photovoltaic fiber in accordance with a third aspect of the innovation.

DETAILED DESCRIPTION

Figure 1A:
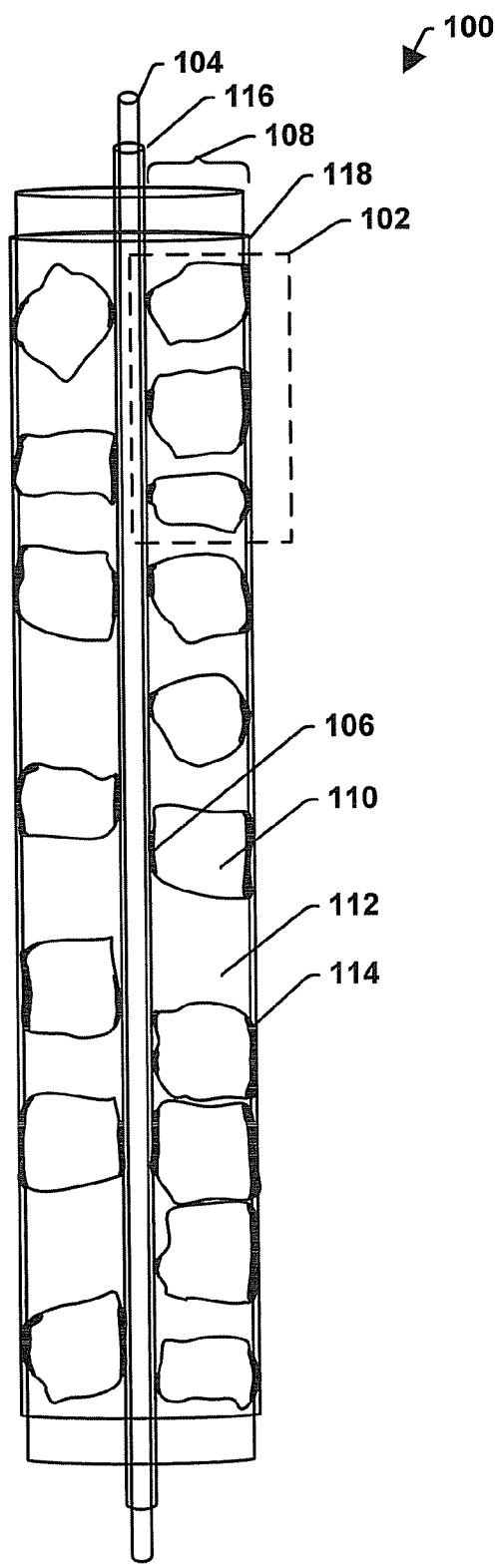
FIGS. 1a and 1b are schematic illustrations of a portion of a photovoltaic fabric in accordance with a first aspect of the subject innovation.

The subject innovation described herein provides photovoltaic fibers and methods of making photovoltaic fibers. The photovoltaic fiber contains a core, bottom metal-semiconductor compounds over the core, a semiconductor layer comprising semiconductor elements and insulating materials over the bottom metal-semiconductor compounds, and upper metal-semiconductor compounds over the semiconductor layer. The bottom metal-semiconductor compounds can be used as a bottom electrode, and the upper metal-semiconductor compounds can be used as an upper electrode.

The photovoltaic fiber can employ semiconductor elements such as semiconductor particles. The photovoltaic fiber does not need the use of a crystal ingot. As a result, the fiber photovoltaic collector is, essentially, not limited to a particular size of, for example, a silicon crystal ingot. Consequently, the fiber photovoltaic collector can be economically produced leading to the economic production of solar cells.

The photovoltaic fiber can be weavable. The photovoltaic fiber can be employed to form a thread, string, yarn, or the like. As a result, a fabric (e.g., woven, non-woven, knit, or the like) including the photovoltaic fiber can be formed. In other words, the subject innovation allows for a photovoltaic collector to be weaved into fabrics and/or incorporated into fabrics.

The fabric containing the photovoltaic fibers can be utilized in any suitable application or photovoltaic collector. For example, the photovoltaic fabrics are a part of garments (e.g. clothes, gloves, aprons, gowns, masks, eyeglasses, footwear, or the like). The photovoltaic fabric may be useful in industrial, military, and emergency situations. Other examples of applications of photovoltaic fabrics include automotive (e.g., upholstery and inside door textile coating), aerospace (e.g., upholstery and wall covering), marine (e.g., sail cloth), architectural and industrial textile applications; roof membranes, awnings, canopies, rug, curtain, parking lot covers, drapery, greenhouse fabrics, window shades, vertical blinds, ceiling board fabrics, smoke and fire barrier fabrics, protective clothing (e.g., chemical and military), tents, coated fabric tarpaulins, outdoor furniture (e.g., patio, deck, and porch), or the like.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

FIG. 1a is a schematic illustration of a portion of an exemplary photovoltaic fiber 100. A portion of the photovoltaic fiber 100 indicated by a dashed line 102 is exploded in FIG. 1b. The photovoltaic fiber 100 contains a core 104, bottom metal-semiconductor compounds 106 over the core 104, a semiconductor layer 108 comprising semiconductor elements 110 and insulating materials 112 over the bottom metal-semiconductor compounds 106, and upper metal-semiconductor compounds 114 over the semiconductor layer 108.

The core 104 can contain any suitable material as long as the material can facilitate to support the shape of the photovoltaic fiber 100. For example, the core 104 contains organic and/or inorganic materials. In one embodiment, the core 104 contains heat resistant organic materials. Specific examples of heat resistant organic materials include aromatic polyamide, aromatic polyester, phenolic resin, poly-p-phenylenebenzobisthiazole, poly-p-phenylenebenzobisoxazole, polybenzimidazole, polyether imide, fluorocarbon, combinations thereof, or the like. In another embodiment, a aromatic polyamide fiber such as poly(p-phenylene terephthalamide) that sold under the tradename KEVLAR® by E.I. Du Pont de Nemours and Co., is employed as a core 104.

The core 104 can have any suitable length and any suitable cross-section dimension such as average diameter, average side length, or the like. The higher limit of core length is controlled only by the ability to handle the core 104. The lower limit of cross-section dimension is controlled only by the ability to handle the core 104. Examples of cross-sectional shape of the core 104 include a circle, oval, square, rectangular, polygon, irregular shape, or the like. The cross-section dimension of the core 104 depends upon the desired implementations and/or the photovoltaic fiber being fabricated. In one embodiment, the core 104 has an average cross-section dimension of about 1 micrometer or more and about 100 micrometers or less. In another embodiment, the core 104 has an average cross-section dimension of about 2 micrometers or more and about 70 micrometers or less. In yet another embodiment, the core 104 has an average cross-section dimension of about 3 micrometers or more and about 50 micrometers or less.

The photovoltaic fiber 100 contains a semiconductor layer 108 between bottom metal-semiconductor compounds 106 and upper metal-semiconductor compounds 114. The semiconductor layer 108 contains semiconductor elements 110 and insulating materials 112 between the semiconductor elements 110. The semiconductor elements 110 can contain any suitable semiconductor material. Examples of semiconductor materials include silicon, germanium, gallium arsenide, indium phosphide, or the like.

The semiconductor elements 110 can be in any suitable form/shape. The semiconductor elements 110 can be in form/shape of powder, flake, particle, granule, pellet, tablet, chips, sphere, plate, rod, or the like. For example, the semiconductor elements 110 are silicon particles. The semiconductor elements 110 can contain doped layers (not shown) in the top portion of the semiconductor elements 110 to form a semiconductor p-n junction.

When the semiconductor elements 110 contain silicon particles, the silicon particles can contain silicon monocrystal, silicon polycrystal, amorphous, or combinations thereof. The silicon particles can be modified by doping with one or more suitable dopants (e.g., a p-type or n-type dopant). The silicon particles can be in any suitable form/shape. For example, the silicon particles are in the form/shape of powder, flake, particle, granule, pellet, tablet, chips, sphere, plate, rod, or the like. Silicon particles have any suitable size or size range (e.g., particle distribution) as long as that size of silicon particles can be used as a semiconductor layer of a photovoltaic fiber. Silicon particles have a suitable particle distribution that depends upon the desired implementations and/or the photovoltaic fiber being fabricated. For example, the lower limit of particle size is controlled only by the ability to handle the particulate silicon.

The size or size range of semiconductor elements 110 can be determined by a thickness of the semiconductor layer 108. The size or size range of semiconductor elements 110 can be adjusted by pulverizing semiconductor elements 110. In one embodiment, the semiconductor elements 110 have a particle distribution wherein at least about 90% by weight of the particles have a particle size of about 5 micrometers or more and about 100 micrometers or less. In another embodiment, the semiconductor elements 110 can have a particle distribution wherein at least about 90% by weight have a particle size of about 7 micrometers or more and about 70 micrometers or less. In yet another embodiment, the semiconductor elements 110 can have a particle distribution wherein at least about 90% by weight have a particle size of about 10 micrometers or more and about 50 micrometers or less.

Semiconductor elements 110 such as silicon particles can be formed by any suitable technique. For example, silicon particles are formed by a fluidized bed process using, for example, monosilane as a source gas, by granulation in a vapor-phase reaction of a silane group, or the like. The details of the structure and manufacture of silicon particles can be found in, for example, U.S. Pat. Nos. 4,691,860 and 5,346,141, which are hereby incorporated by reference. In one embodiment, silicon particles are formed by melting solar grade p-type silicon having a resistivity of about 1 ohm centimeters or more and about 10 ohm centimeters, for example. In another embodiment recycled Si wafers from production of semiconductors can be pulverized to produce powders of suitable particle sizes. In yet another embodiment, silicon particles are etched to remove contamination or surface damage by an etchant of nitric and hydrofluoric acids.

The insulating material 112 can contain any suitable electrically insulating material. The semiconductor layer 108 can contain the insulating layer to insulate the bottom electrode (e.g., bottom metal-semiconductor compounds) 106 from the upper electrode (e.g., upper metal-semiconductor compounds) 114. The insulating material 112 can contain organic insulating materials, inorganic insulating materials, and composites of both organic and inorganic insulating materials. Examples of organic insulators include polyimides, benzocyclobutenes, parylenes, polyacrylates, polyurethanes, polyvinylbutyrals, polyvinylphenols, and the like. Examples of inorganic insulators include silicon based dielectric materials, oxide dielectric materials, nitride dielectric materials, silicates, high k materials, and low k materials. Examples of silicon based dielectric materials include silicon dioxide, and silicon oxynitride. Examples of silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable spin-on glasses. Examples of low k materials include one or more of polyimides, fluorinated polyimides, polysilsequioxane, benzocyclobutene (BCB), poly(arylene ester), parylene F, parylene N and amorphous polytetrafluoroethylene.

The bottom metal-semiconductor compounds 106 and the upper metal-semiconductor compounds 114 can contain any suitable metal-semiconductor compounds as long as they can be used as electrodes. Examples of meal-semiconductor compounds include meal silicides, metal germanides, metal germanosilicides, or the like. The bottom metal-semiconductor compounds 106 can be the same as or different from the upper metal-semiconductor compounds 114. In one embodiment, the bottom metal-semiconductor compounds 106 and/or the upper metal-semiconductor compounds 114 contain transparent metal-semiconductor compounds. Examples of transparent metal-semiconductor compounds include metal silicides such as titanium silicides, nickel silicides, tungsten silicides, tantalum silicides, gold silicides, silver silicides, aluminum silicides, platinum silicides, copper silicides, cobalt silicides, iridium silicides, tungsten silicides, molybdenum silicides, ruthenium silicides, palladium silicides, combinations thereof, or the like.

The bottom metal-semiconductor compounds 106 can be formed by a chemical reaction between a bottom metal layer 116 on the core 104 and the bottom surfaces of the semiconductor elements 110. The upper metal-semiconductor compounds 114 can be formed by a chemical reaction between the upper surfaces of the semiconductor elements 110 and an upper metal layer 118 on the semiconductor elements 110. When the bottom metal-semiconductor compounds 106 and/or the upper metal-semiconductor compounds 114 are formed by the metal-semiconductor chemical reaction, the photovoltaic fiber can contain a bottom metal layer 116, an upper metal layer 118, or a combination thereof.

In one embodiment, the uppermost surfaces of the semiconductor elements 110 do not substantially contain nontransparent metal-semiconductor compounds. Since any nontransparent metal-semiconductor compounds does not substantially exist over the uppermost surfaces of the semiconductor elements 110, penetration of light into the semiconductor elements 110 is not inhibited, prevented, and/or mitigated, thereby improving the photoelectric conversion efficiency per unit area of the photovoltaic fiber.

The bottom metal-semiconductor compounds 106 and the upper metal-semiconductor compounds 114 can have any suitable height or thickness that depends on, for example, the desired implementations and/or the photovoltaic fiber 300 being fabricated. In one embodiment, the bottom metal-semiconductor compounds 106 and the upper metal-semiconductor compounds 114 have independently a height or thickness of about 0.05 micrometer or more and about 10 micrometers or less. In another embodiment, the bottom metal-semiconductor compounds 106 and the upper metal-semiconductor compounds 114 have independently a height or thickness about 0.3 micrometer or more and about 7 micrometers or less. In yet another embodiment, the bottom metal-semiconductor compounds 106 and the upper metal-semiconductor compounds 114 have independently a height or thickness about 0.5 micrometer or more and about 5 micrometers or less.

Although the photovoltaic fiber 100 can employ any suitable semiconductor element and any suitable bottom and upper metal-semiconductor compound, the innovation is hereinafter illustrated and described in the context of an exemplary photovoltaic fiber containing silicon particles as the semiconductor elements 110 and metal silicides as the bottom and upper metal-semiconductor compounds. The photovoltaic fiber 100 can contain any suitable other layer/component. In one embodiment, the photovoltaic fiber 100 contains a protective layer (not shown) at the outer surface of the photovoltaic fiber 100.

When the photovoltaic fiber contains a bottom metal layer and/or an upper metal layer 116, 118, the metal layers can contain any suitable metal material. Examples of meal materials include metals, metal alloys, metal oxides, or the like. Specific examples of metal materials include aluminum (Al), gold (Au), platinum (Pt), copper (Cu), silver (Ag), cobalt (Co), iridium (Ir), tungsten (W), and molybdenum (Mo), ruthenium (Ru), nickel (Ni), nickel oxide (NiO), palladium (Pd), tantalum (Ta), tantalum nitride (TaN), titanium (Ti), titanium nitride (TiN), cobalt oxide (CoO), combinations and alloys thereof, or the like. The metal layer can be formed by any suitable technique. For example, physical vapor deposition (PVD), chemical vapor deposition (CVD), electroplating, sputtering, evaporation, and the like can be used to form the conductive layer 304.

The metal layer 116, 118 can have any suitable height/thickness so that the metal layer 116, 118 can be used for forming metal-semiconductor compounds. In one embodiment, the metal layer 116, 118 has a height or thickness of about 0.01 micrometer or more and about 5 micrometers or less. In another embodiment, the metal layer 116, 118 has a height or thickness of about 0.02 micrometers or more and about 3 micrometers or less. In yet another embodiment, the metal layer 116, 118 has a height of about 0.05 micrometer or more and about 2 micrometers or less.

The photovoltaic fiber 100 can have any suitable length and any suitable cross-section dimension such as average diameter, average side length, or the like. The higher limit of photovoltaic fiber length is controlled only by the ability to handle the photovoltaic fiber. The lower limit of cross-section dimension is controlled only by the ability to handle the photovoltaic fiber. Examples of cross-sectional shape of the photovoltaic fiber include a circle, oval, square, rectangular, polygon, irregular shape, or the like. The cross-section dimension of the photovoltaic fiber 100 depends upon the desired implementations and/or the photovoltaic fiber being fabricated. In one embodiment, the photovoltaic fiber 100 has an average cross-section dimension of about 20 micrometers or more and about 500 micrometers or less. In another embodiment, the photovoltaic fiber 100 has an average cross-section dimension of about 25 micrometers or more and about 450 micrometers or less. In yet another embodiment, the photovoltaic fiber 100 has an average cross-section dimension of about 30 micrometers or more and about 250 micrometers or less.

Figure 1B:
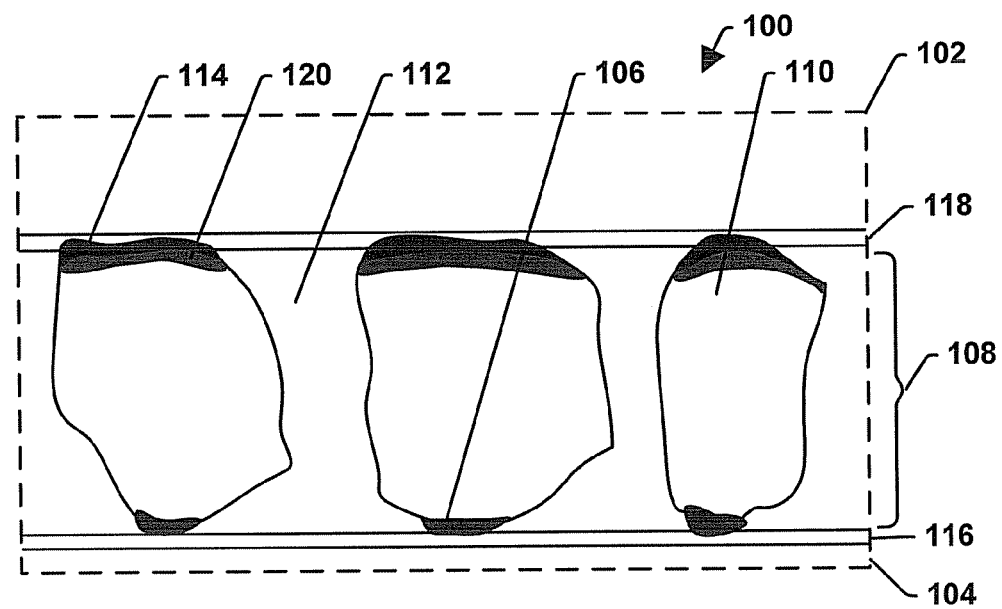

FIG. 1*b* illustrates an exploded view of a portion of the photovoltaic fiber 100 indicated by a dashed line 102 in FIG. 1*a*. The photovoltaic fiber 100 contains a core 104, bottom metal-semiconductor compounds 106 over the core 104, a semiconductor layer 108 over the bottom metal-semiconductor compounds 106, and upper metal-semiconductor compounds 114 over the semiconductor layer 108. The semiconductor layer 108 can contain semiconductor elements 110 and insulating materials 112 between the semiconductor elements 110. The semiconductor elements 110 can contain doped layers 120 in the top surfaces of the semiconductor elements 110 to form a semiconductor p-n injunction. When the bottom metal-semiconductor compounds 106 and/or the upper metal-semiconductor compounds 114 are formed by a metal-semiconductor chemical reaction, the photovoltaic fiber can contain a bottom metal layer 116, an upper metal layer 118, or a combination thereof.

The upper metal-semiconductor compounds 114 are formed at uppermost portions of the semiconductor elements 110. The upper metal-semiconductor compounds 114 can contain transparent metal-semiconductor compounds.

Figure 1C:
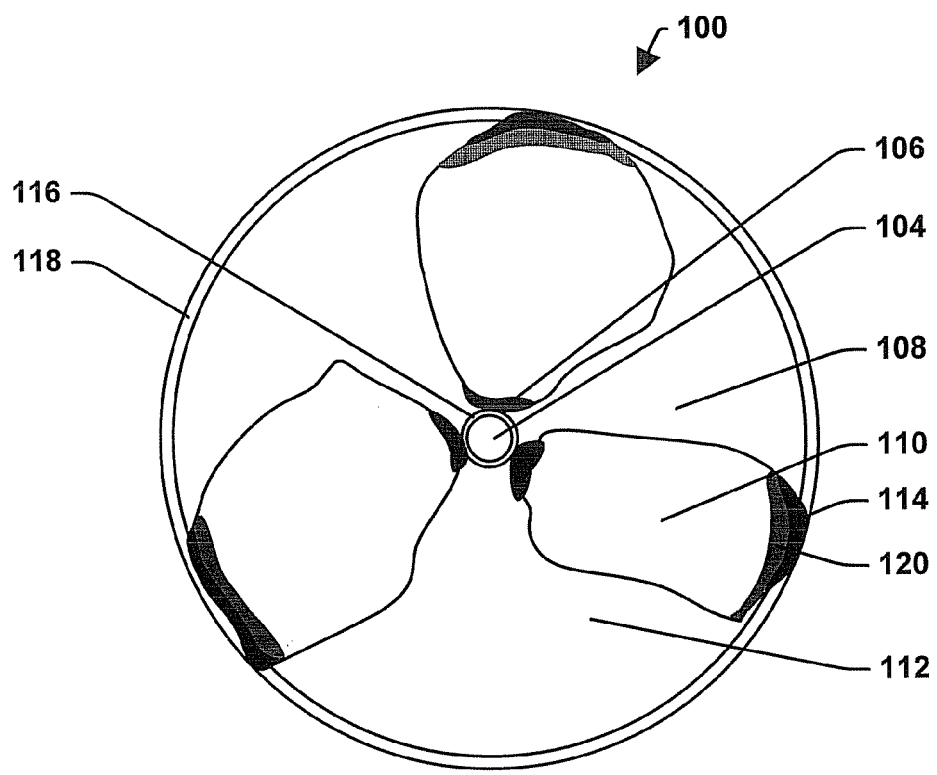
FIG. 1c is a cross-sectional illustration of a portion of a photovoltaic fabric in accordance with a first aspect of the subject innovation.

FIG. 1c illustrates a cross-sectional view of a portion of the photovoltaic fiber 100 of FIG. 1a. The photovoltaic fiber 100 contains a core 104, bottom metal-semiconductor compounds 106 over the core 104, a semiconductor layer 108 over the bottom metal-semiconductor compounds 106, and upper metal-semiconductor compounds 114 over the semiconductor layer 108. The semiconductor layer 108 can contain semiconductor elements 110 such as semiconductor particles and insulating materials 112 between the semiconductor elements 110. When the bottom metal-semiconductor compounds 106 and/or the upper metal-semiconductor compounds 114 are formed by a metal-semiconductor chemical reaction, the photovoltaic fiber 100 can contain a bottom metal layer 116, an upper metal layer 118, or a combination thereof. The semiconductor elements 110 can contain doped layers 120 in the top surfaces of the semiconductor elements 110. In this example, the shape of the cross-section of the photovoltaic fiber 100 is a circle.

Figure 2A:
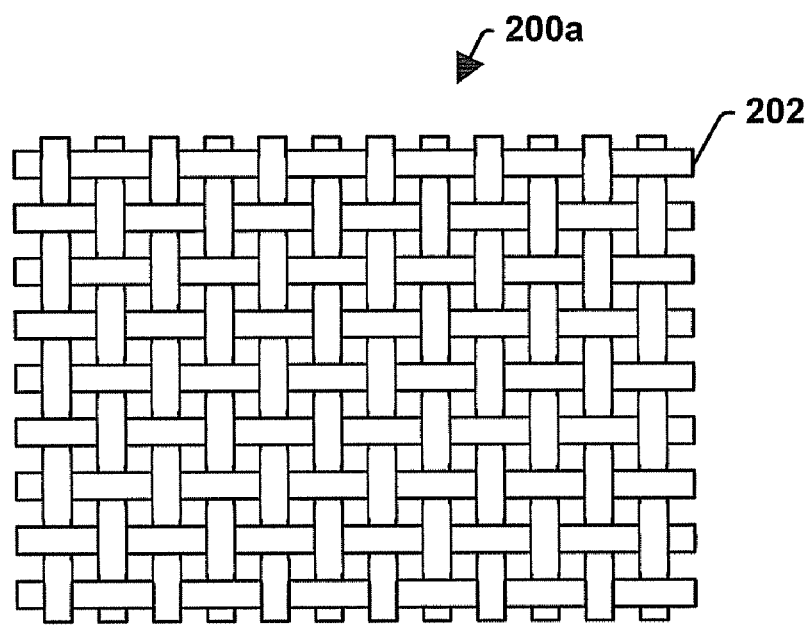
FIGS. 2a and 2b are schematic illustrations of a photovoltaic fabric in accordance with a second aspect of the subject innovation.
Figure 2B:
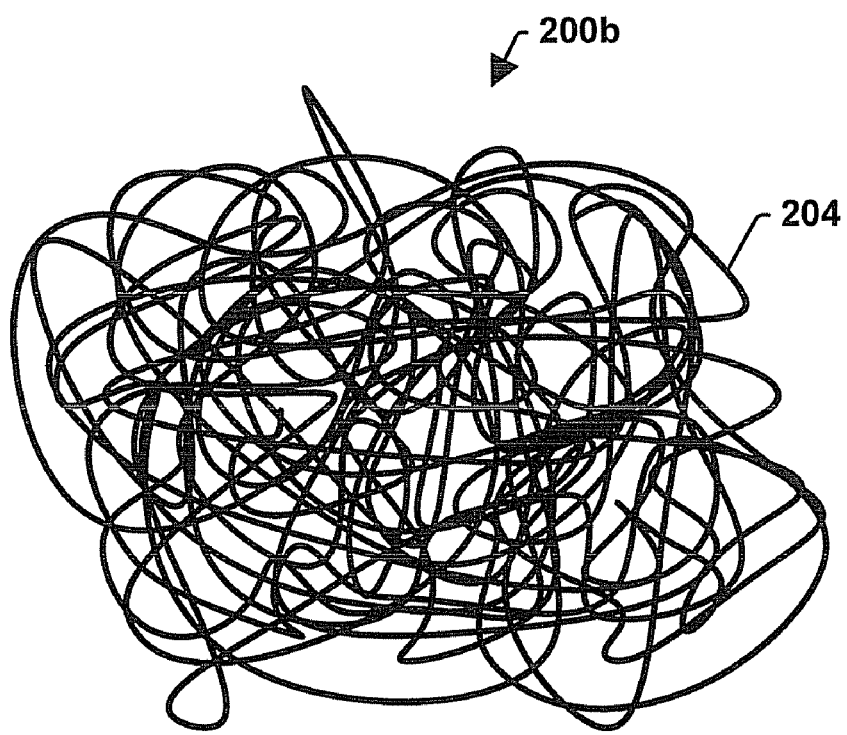

FIGS. 2a and 2b illustrate two of many possible exemplary embodiments of applications of the photovoltaic fiber. FIG. 2a illustrates a photovoltaic woven fabric 200a containing photovoltaic fibers 202. The woven fabric can be formed by weaving photovoltaic fibers. In another embodiment, the woven fabric is formed by weaving threads, strings, and/or yarns 202 that contain the photovoltaic fibers. The photovoltaic woven fabric can be a flexible, semi-rigid, or rigid fabric. The rigidity of the photovoltaic woven fabric 200a can be selected by varying the tightness of the weave, the thickness of the strands of the photovoltaic fabrics, and/or the rigidity of the photovoltaic fabrics used. The photovoltaic fabrics can be woven with or without other materials. In addition, strands of the photovoltaic fabrics can be welded together to form a fabric.

FIG. 2b illustrates a photovoltaic non-woven fabric 200b containing photovoltaic fibers 204. The photovoltaic non-woven fabric 200b can be a flexible, semi-rigid, or rigid fabric. The photovoltaic non-woven fabric 200b can be formed with or without other materials.

Figure 3:
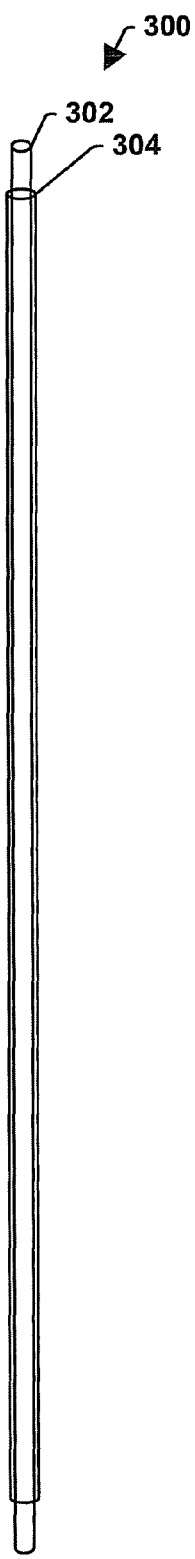

Referring to FIGS. 3 to 7, one of many possible exemplary embodiments of forming a photovoltaic fiber is specifically illustrated. FIG. 3 illustrates a schematic illustration of an intermediate state of a portion of an exemplary photovoltaic fiber 300. A core 302 is provided and a first conductive layer 304 such as a metal layer is formed over the core 302.

The first conductive layer 304 can contain any suitable conductive material. For example, the first conductive layer 304 contains any suitable metal material that can react with semiconductor materials and form metal-semiconductor compounds. The first conductive layer 304 and/or the metal-semiconductor compounds can serve as a bottom electrode for the photovoltaic fiber 300. Examples of conductive materials include conductive metal, conductive metal alloys, conductive metal oxides, semiconductive materials, or the like.

The first conductive layer 304 can be formed by any suitable technique. PVD, CVD, electroplating, sputtering, evaporation, spraying, coating, or the like can be used to form the first conductive layer 304.

The first conductive layer 304 can have any suitable height or thickness so that the first conductive layer 304 can be used as a bottom electrode for the photovoltaic fiber 300 being fabricated. In one embodiment, the first conductive layer 304 has a height or thickness of about 0.01 micrometer or more and about 10 micrometers or less. In another embodiment, the first conductive layer 304 has a height of about 0.05 micrometers or more and about 7 micrometers or less. In yet another embodiment, the first conductive layer 304 has a height of about 0.1 micrometer or more and about 5 micrometers or less.

Figure 4:
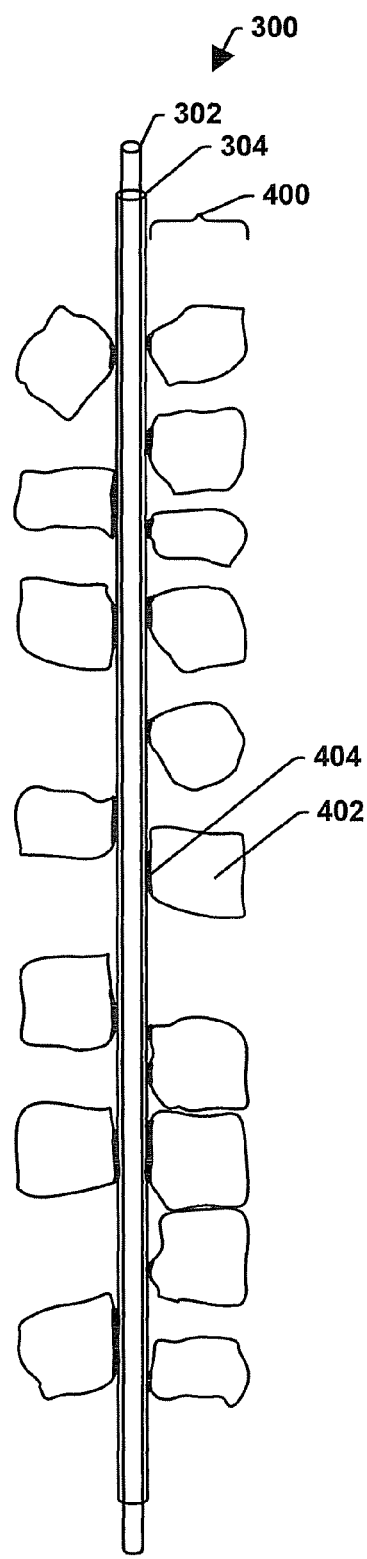

FIG. 4 illustrates forming a semiconductor layer 400 containing semiconductor elements 402 and forming first metal-semiconductor compounds 404 between the semiconductor layer 400 and the first conductive layer 304. The semiconductor layer 400 can be formed by any suitable technique, for example, by placing semiconductor elements 402 such as silicon particles (e.g., silicon grains or the like) on the first conductive layer 304. In one embodiment, the core 302 with the first conductive layer 304 is contacted with semiconductor elements 402, and then the first metal-semiconductor compounds 404 is formed by heating the conductive layer 304 and semiconductor elements 402.

The semiconductor layer 400 can contain any suitable amount of semiconductor elements (e.g., silicon particles) 402. In one embodiment, the semiconductor layer 400 contains a large amount of semiconductor elements 402 so that substantially all of the semiconductor elements 402 are in direct contact with each other. In another embodiment, the semiconductor layer 400 contains semiconductor elements 402 so that some of the semiconductor elements are in direct contact each other, but substantially all of the semiconductor elements 402 are not in direct contact with each other.

FIG. 4 also illustrates forming first metal-semiconductor compounds 404 over an interface between the semiconductor layer 400 and the first conductive layer 304. The first metal-semiconductor compounds 404 can be used as a bottom electrode of the photovoltaic fiber 300 being fabricated. The first metal-semiconductor compounds 404 can be referred to as bottom metal-semiconductor compounds or a bottom electrode. The first metal-semiconductor compounds 404 contain metal atoms from the first conductive layer 304 and semiconductor atoms from the semiconductor layer 400. When the first metal-semiconductor compounds 404 contain metal silicides, the metal silicides contain metal atoms from the first conductive layer 304 and silicon atoms from the silicon layer 400. Examples of metal silicides include aluminum silicide, gold silicide, platinum silicide, copper silicide, silver silicide, cobalt silicide, iridium silicide, tungsten silicide, and molybdenum silicide, ruthenium silicide, nickel silicide, palladium silicide, tantalum silicide, titanium silicide, combinations thereof, or the like.

The first metal-semiconductor compounds 404 can be formed by any suitable technique. For example, when the first metal-semiconductor compounds 404 contain metal silicides, the metal silicides 404 are formed by heating the first conductive layer 304 and the silicon layer 400 to cause a chemical reaction between the two layers. During the salicidation process, the metal of the first conductive layer 304 can diffuse into the semiconductor elements 402 and form the first metal-semiconductor compounds 404. As a result, the first metal-semiconductor compounds 404 are self-aligned to the bottom surface of the semiconductor elements 402.

Choice of suitable conditions and parameters (e.g., temperature, duration of heat treatment, and the like) of the silicidation process depends on, for example, the desirable dimensions (e.g., height or thickness) of the first metal-semiconductor compounds 404, the configuration and/or constituent of the first conductive layer 304 and/or the semiconductor layer 400, the desired implementations and/or the photovoltaic fiber 300 being fabricated, or the like. For example, the first metal silicides 402 are formed by rapid thermal annealing (RTA).

FIG. 5 illustrates forming an insulating material 500 between the semiconductor elements 402 (e.g., silicon particles) in the semiconductor layer 400 and forming doped layers (not shown) in the top surfaces of the semiconductor elements 402. The insulating material 500 is formed to, for example, insulate and cover the first conductive layer 304 and the first metal-semiconductor compounds 404. The insulating material 500 can contain any suitable electrically insulating material. In one embodiment, the insulating material 500 contains any of the insulating materials described in connection with the insulating material 112 in FIG. 1a.

The insulating material 500 can be formed in the semiconductor layer 400 by any suitable technique. For example, an insulating material layer is formed over the core 302 and an upper portion of the insulating material layer is removed, thereby leaving insulating materials 500 in the semiconductor layer 400 and exposing the uppermost surface of the semiconductor elements 402.

The insulating material layer can be formed by any suitable technique, for example, deposition techniques (e.g., CVD; coating such as dip coating and spray coating; casting; or the like). An upper portion of the insulating material layer can be removed by any suitable technique. For example, the upper portion is removed by etching. Etching can be carried out using any suitable etchant. For example, etching can be by a wet etch or a dry etch. Dry etching may include plasma etching, reactive ion etching (RIE), and the like. For example, when the insulating material layer contains oxide materials, the upper portion of the insulating material layer can be removed by contacting the insulating material layer with any suitable oxide etchant that does not substantially affect or damage the integrity of other layers in the photovoltaic fiber 300 such as the semiconductor layer 400. Any suitable etchant can be used as long as it is capable of removing the upper portion of the insulating material layer selective to other layers. Due to the removal of the upper portion of the insulating material layer, the upper surface of the semiconductor elements 402 can be exposed.

Doped layers can be formed in top surfaces of the semiconductor elements 402 by any suitable technique. For example, the doped layers are formed by implantation of one or more dopants from the top of the silicon layer 400. Any suitable implant compositions and concentrations can be employed for the doped layers. For example, the doped layers include one or more N-type dopants (e.g., arsenic, phosphorous, antimony). Such dopants can be implanted at a dose of about 0.2E15 atoms/cm$^2$ or more and about 4E15 atoms/cm$^2$ or less and at an energy level of about 2 KeV or more and about 40 KeV or less, for example.

Alternatively, doped layers can be formed by direct diffusion of dopant atoms into semiconductor elements 402 from a suitable source. Examples of sources include liquid ion sources, solid state electrolytes, and gas sources. The details of forming doped layers by the direct diffusion of dopant atoms can be found in, for example, U.S. Pat. Nos. 2,560,792, 4,032,418, 4,392,928, 4,498,092, and 5,180,690, which are hereby incorporated by reference.

The doped layers can have any suitable height or thickness to provide p-n junctions or Schottky junctions in the semiconductor elements 404. For example, the doped layers have a height of about 0.2 micrometers.

The doped layers can be formed at any suitable time. For example, the doped layers are formed at any suitable time after forming the semiconductor layer 400 and before forming second metal-semiconductor compounds described below. In one embodiment, the doped layers are formed before forming the insulating materials 500. In another embodiment, the doped layers are formed after forming the insulating materials 500.

FIG. 6 illustrates forming second metal-semiconductor compounds 600 at uppermost portions of the semiconductor elements 402, thereby forming a photovoltaic fiber 300. The second metal-semiconductor compounds 600 can contain any suitable metal-semiconductor materials. In one embodiment, the second metal-semiconductor compounds 600 contain any suitable metal silicide materials. For example, the second metal silicides 600 contain any of the metal silicides described in connection with the first metal-semiconductor compounds 404 in FIG. 4. The second metal-semiconductor compounds 600 can be the same as or different from the first metal-semiconductor compounds 404.

The second metal-semiconductor compounds 600 can be formed by any suitable technique. For example, when the second metal-semiconductor compounds 600 contain metal silicides, the metal silicides 600 are formed by forming a second conductive layer 602 containing metals over the semiconductor layer 400, heating the second conductive layer 602 and the semiconductor layer 400 to cause a chemical reaction between the second conductive layer 602 and the semiconductor elements 402. Although not shown in the Figures, the chemical reactions occur at the bottom and top surfaces of semiconductor layer 400 to form first and second metal-semiconductor compounds 404, 600 at the same time.

The second conductive layer 602 can contain any suitable metal material. For example, the second conductive layer 602 contains any of the metals described in connection with the conductive layer 304 in FIG. 3. The second conductive layer 602 can be formed by any suitable technique. For example, the second conductive layer 602 is formed by PVD, CVD, electroplating, sputtering, evaporation, spraying, coating, or the like. The second conductive layer 602 can have any suitable height or thickness so that second metal-semiconductor compounds 600 formed from the second conductive layer 602 can be used as an upper electrode for the photovoltaic fiber 300. In one embodiment, the second conductive layer 602 has a height or thickness of about 0.01 micrometer or more and about 10 micrometers or less. In another embodiment, the second conductive layer 602 has a height or thickness of about 0.05 micrometers or more and about 7 micrometers or less. In yet another embodiment, the second conductive layer 602 has a height or thickness of about 0.1 micrometer or more and about 5 micrometers or less.

The second conductive layer 602 and the semiconductor layer 400 can be heated to form second metal-semiconductor compounds 600 at the interface between the semiconductor layer 400 and the second conductive layer 602. By heating the second conductive layer 602 and the semiconductor layer 400, a chemical reaction occurs between the second conductive layer 602 and the semiconductor elements 402. Choice of suitable conditions and parameters (e.g., temperature, duration of heat treatment, and the like) of the process depends on, for example, the desirable dimensions (e.g., height) of the second metal-semiconductor compounds 600, the configuration and/or constituent of the second conductive layer 602 and/or the semiconductor elements 402, the desired implementations and/or the photovoltaic fiber 300 being fabricated, or the like.

In one embodiment, when the second conductive layer 602 contains titanium, titanium silicides are formed at uppermost portions of the semiconductor elements 402 by heating the second conductive layer 602 and the semiconductor elements 402 at a temperature of about 250 degrees Celsius or more and about 700 degrees Celsius or less for about 5 minutes or more and about 500 minutes or less. In another embodiment, when the second conductive layer 602 contains nickel, nickel silicides are formed at uppermost portions of the semiconductor elements 402 by heating the second conductive layer 602 and the semiconductor elements 402 at a temperature of about 250 degrees Celsius or more and about 750 degrees Celsius or less for about 5 minutes or more and about 500 minutes or less.

The resultant second metal-semiconductor compounds 600 can have any suitable height or thickness that depends on, for example, the desired implementations and/or the photovoltaic fiber 300 being fabricated. In one embodiment, the second metal-semiconductor compounds 600 have a height or thickness of about 0.1 micrometer or more and about 10 micrometers or less. In another embodiment, the second metal-semiconductor compounds 600 have a height or thickness of about 0.3 micrometers or more and about 7 micrometers or less. In yet another embodiment, the second metal-semiconductor compounds 600 have a height or thickness of about 0.5 micrometers or more and about 10 micrometers or less.

The second metal-semiconductor compounds 600 can be formed by a chemical reaction between the semiconductor elements 402 and the second conductive layer 602 formed on the upper surface of the semiconductor layer 400. As a result, the second metal-semiconductor compounds 600 are self-aligned to the upper surface of the semiconductor elements 402. In addition, the second metal-semiconductor compounds can contain transparent metal-semiconductor compounds. In this connection, since substantially any non-transparent metal-semiconductor compound does not exist over the uppermost surfaces of the semiconductor elements 402, penetration of light into the semiconductor elements 402 is not inhibited, prevented, and/or mitigated, thereby improving the photoelectric conversion efficiency per unit area of the photovoltaic fiber 300. This can allow the use of lower powered light sources.

Since the upper surfaces of the semiconductor elements 402 contain doped layers (e.g., n-type layers), the second metal-semiconductor compounds 600 and the second conductive layer 602 can electrically connect substantially all the doped layers of the semiconductor elements 402. In other words, the second metal-semiconductor compounds 600 and the second conductive layer 602 can be continuous over the doped layers of substantially all of the semiconductor elements 402. As a result, the second metal-semiconductor compounds 600 and the second conductive layer 602 can be used as an upper electrode of the photovoltaic fiber 300.

Figure 7:
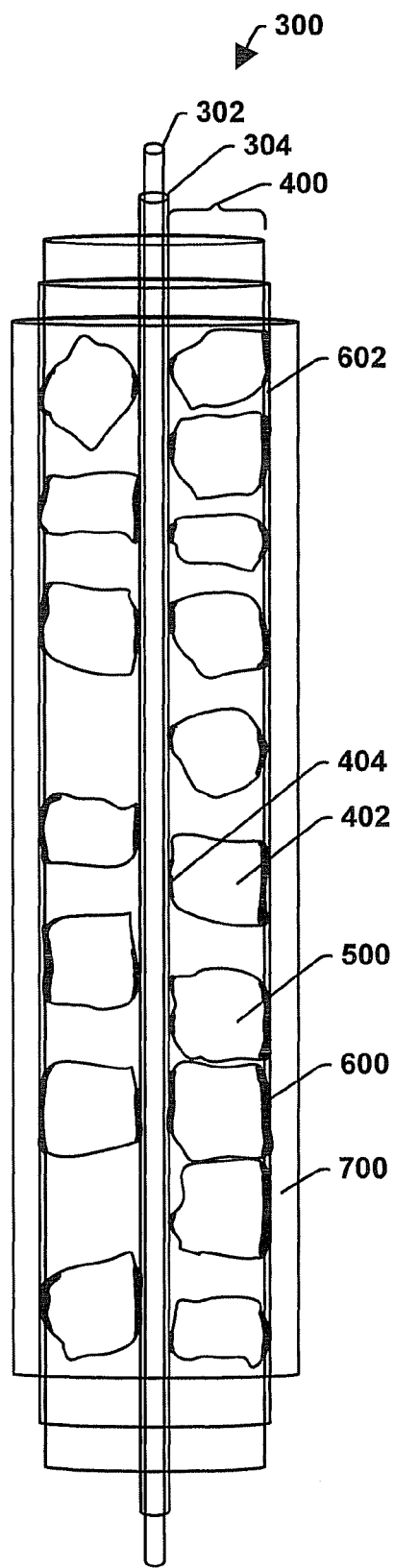

FIG. 7 illustrates forming a protective layer (e.g., protective coating) 700 over the semiconductor layer 400. The photovoltaic fiber 300 may or may not contain the protective layer 700. The photovoltaic fiber 300 can contain a protective layer to, for example, protect the photovoltaic fiber 300 from damage and to increase durability of the photovoltaic fiber 300. The protective layer 700 typically contains transparent materials. The protective layer can contain any suitable material such as insulating materials. For example, the protective layer 700 contains any of the materials described in connection with the insulating material 112 in FIG. 1.

Figure 8:
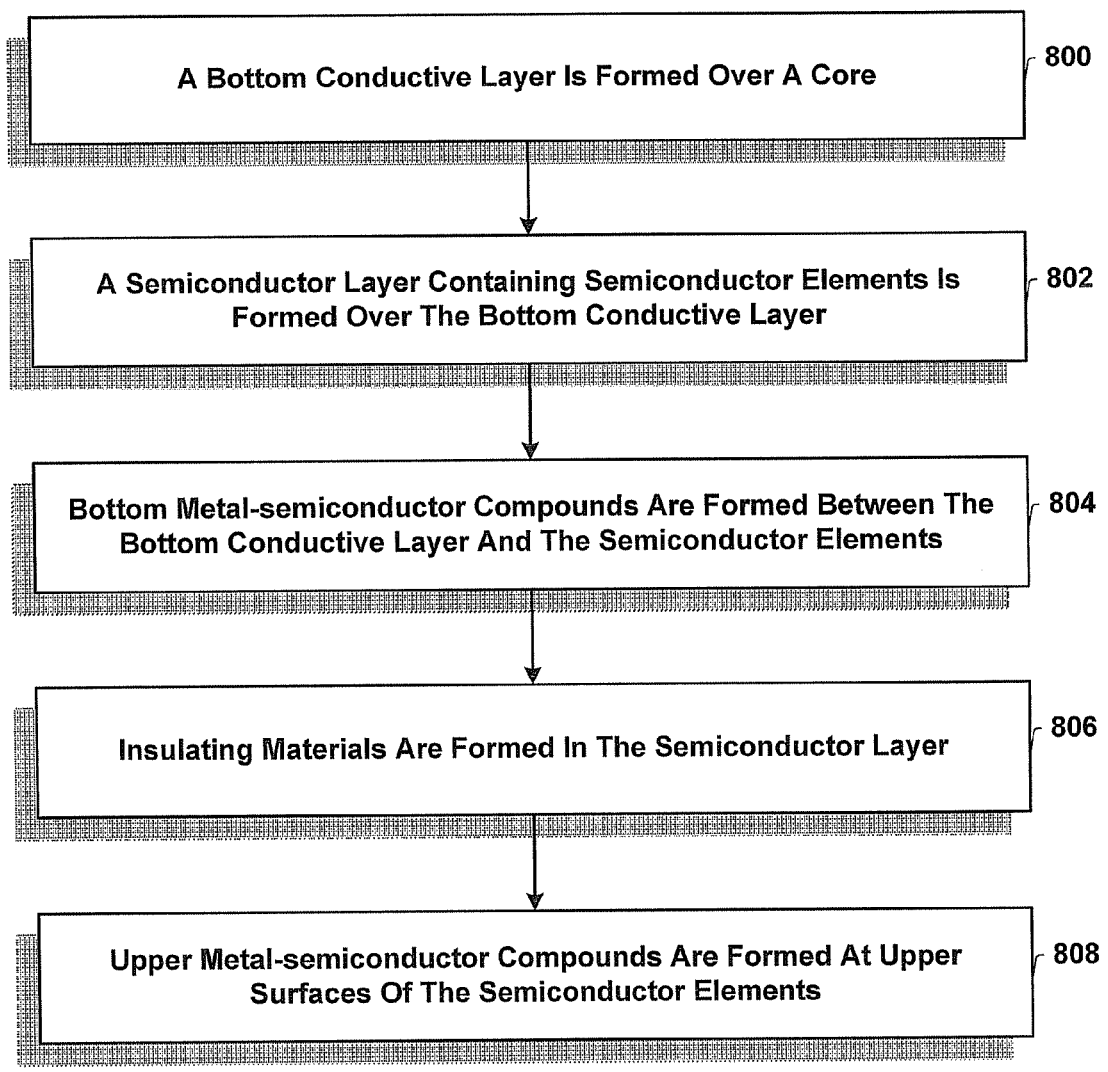
FIG. 8 illustrates an exemplary methodology of forming a photovoltaic fiber in accordance with a fourth aspect of the subject innovation.

FIG. 8 illustrates an exemplary methodology of forming a photovoltaic fiber. At 800, a bottom conductive layer is formed over a core. At 802, a semiconductor layer containing semiconductor elements is formed over the bottom conductive layer. At 804, bottom metal-semiconductor compounds 106 are formed between the bottom conductive layer and the semiconductor elements. At 806, insulating materials are formed in the semiconductor layer. At 808, upper metal-semiconductor compounds are formed at the upper surfaces of the semiconductor elements.

Although not shown in FIG. 8, in one embodiment, the bottom metal-semiconductor compounds 106 are formed by forming a metal layer over the core, and heating the metal layer and the semiconductor layer to cause a chemical reaction between the metal layer and the semiconductor elements. In another embodiment, the upper metal-semiconductor compounds are formed by forming a metal layer over an upper surface of the semiconductor layer; and heating the metal layer and the semiconductor layer to cause a chemical reaction between the metal layer and the semiconductor elements. In yet another embodiment, the method further involves forming doped layers at upper surfaces of the semiconductor elements. In still yet another embodiment, the method further involves forming a protective layer over the upper metal-semiconductor compounds.

Although not shown in FIG. 8, the photovoltaic fiber fabrication processes described herein can further include any suitable semiconductor structure fabrication process. General examples of semiconductor structure fabrication processes include masking, patterning, etching, planarization, thermal oxidation, implant, annealing, thermal treatment, and deposition techniques normally used for making semiconductor structures.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications and variations that fall within the spirit and scope of the appended claims. Furthermore, to the extent that the term "contain," "include," and "involve," are used in either the detailed description or the claims, such terms are intended to be inclusive in a manner similar to the term "comprising" as "comprising" is interpreted when employed as a transitional word in a claim.

What is claimed is:

1. A photovoltaic fiber comprising:
   a core;
   a bottom metal layer over the core;
   a semiconductor layer comprising silicon particles and insulating materials over the bottom metal layer; and
   an upper metal layer over the semiconductor layer, wherein the silicon particles comprise doped layers in top surfaces, bottom metal silicides, and upper metal silicides;
   the bottom metal silicides are in contact with the bottom metal layer; and
   the upper metal silicides and the upper metal layer electrically connect the doped layers of the silicon particles.

2. The photovoltaic fiber of claim 1 wherein the core comprises aromatic polyamides.

3. The photovoltaic fiber of claim 1 wherein the bottom metal silicides, the upper metal silicides, or a combination thereof comprises titanium silicides, nickel silicides, tungsten silicides, tantalum silicides, gold silicides, silver silicides, aluminum silicides, platinum silicides, copper silicides, cobalt silicides, iridium silicides, tungsten silicides, molybdenum silicides, ruthenium silicides, palladium silicides, or combinations thereof.

4. The photovoltaic fiber of claim 1 wherein the bottom metal silicides are a chemical reaction product between the bottom metal layer and the bottom surface of the silicon particles, and the upper metal silicides are a chemical reaction product between the upper metal layer and the upper surface of the silicon particles.

5. The photovoltaic fiber of claim 1 wherein the upper metal silicides and the upper metal layer are continuous over the doped layers of substantially all of the silicon particles.

6. The photovoltaic fiber of claim 1 wherein the upper metal silicides comprise transparent metal silicides.

7. The photovoltaic fiber of claim 1 wherein the upper metal layer is a titanium layer.

8. The photovoltaic fiber of claim 1 wherein the silicon particles have a particle distribution wherein at least about 90% by weight of the silicon particles have a particle size of about 5 micrometers or more and about 100 micrometers or less.

9. The photovoltaic fiber of claim 1 further comprising a protective layer over the upper metal layer.

10. A photovoltaic collector comprising the photovoltaic fiber of claim 1.

11. A photovoltaic fabric comprising a photovoltaic fiber, the photovoltaic fiber comprising:
   a core;
   a bottom metal layer over the core;
   a semiconductor layer comprising silicon particles and insulating materials over the bottom metal layer; and
   an upper metal layer over the semiconductor layer, wherein
   the silicon particles comprise doped layers in top surfaces, bottom metal silicides, and upper metal silicides;
   the bottom metal silicides are in contact with the bottom metal layer; and
   the upper metal silicides and the upper metal layer electrically connect the doped layers of the silicon particles.

12. The photovoltaic fabric of claim 11, wherein the photovoltaic fabric is selected from a group consisting of a woven fabric, a non-woven fabric, and a knit fabric.

13. The photovoltaic fabric of claim 11, wherein the photovoltaic fabric comprises a thread, string, or yarn comprising the photovoltaic fiber.

14. The photovoltaic fabric of claim 11 wherein the bottom metal silicides are a chemical reaction product between the bottom metal layer and the bottom surface of the silicon particles, and the upper metal silicides are a chemical reaction product between the upper metal layer and the upper surface of the silicon particles.

15. The photovoltaic fabric of claim 11, wherein the bottom metal silicides, the upper metal silicides, or a combination thereof comprises titanium silicides, nickel silicides, tungsten silicides, tantalum silicides, gold silicides, silver silicides, aluminum silicides, platinum silicides, copper silicides, cobalt silicides, iridium silicides, tungsten silicides, molybdenum silicides, ruthenium silicides, palladium silicides, or combinations thereof.

16. The photovoltaic fabric of claim 11, wherein the upper metal silicides and the upper metal layer are continuous over the doped layers of substantially all of the silicon particles.

17. The photovoltaic fabric of claim 11, wherein the upper metal silicides comprise transparent metal silicides.

18. The photovoltaic fabric of claim 11, wherein the upper metal layer is a titanium layer.

19. The photovoltaic fabric of claim 11, wherein the bottom metal layer and the upper metal layer are a titanium layer.

20. The photovoltaic fabric of claim 11, wherein the photovoltaic fiber further comprises a protective layer over the upper metal layer.

* * * * *